United States Patent [19]
Azdasht

[11] Patent Number: 5,653,381
[45] Date of Patent: Aug. 5, 1997

[54] PROCESS AND APPARATUS FOR PRODUCING A BONDED METAL COATING

[75] Inventor: Ghassem Azdasht, Berlin, Germany

[73] Assignee: Fraunhofer-Gesellschaft Zur Förderung der Angerwandten Forshung E.V., Munich, Germany

[21] Appl. No.: 381,989

[22] PCT Filed: Jun. 16, 1994

[86] PCT No.: PCT/DE94/00678

§ 371 Date: Feb. 8, 1995

§ 102(e) Date: Feb. 8, 1995

[87] PCT Pub. No.: WO95/00279

PCT Pub. Date: Jan. 5, 1995

[30] Foreign Application Priority Data

Jun. 17, 1993 [DE] Germany .................... 43 20 055.9

[51] Int. Cl.⁶ .................. B23K 1/00; B23K 3/06
[52] U.S. Cl. .................. 228/254; 228/14; 228/41
[58] Field of Search .................. 228/254, 253, 228/41, 14

[56] References Cited

U.S. PATENT DOCUMENTS

| | | | |
|---|---|---|---|
| 3,304,403 | 2/1967 | Harper | 219/121 |
| 4,899,924 | 2/1990 | Kawaguchi | 228/242 |
| 4,906,812 | 3/1990 | Nied et al. | 219/121.63 |
| 5,042,708 | 8/1991 | Ledermann et al. | 228/41 |
| 5,065,932 | 11/1991 | Hayden et al. | 228/41 |
| 5,421,504 | 6/1995 | Spirig | 228/41 |

FOREIGN PATENT DOCUMENTS

| | | |
|---|---|---|
| 423433 | 4/1991 | European Pat. Off. . |
| 2605176 | 4/1988 | France . |
| 4038765A1 | 6/1992 | Germany . |
| 5208258 | 8/1993 | Japan . |

*Primary Examiner*—P. Austin Bradley
*Assistant Examiner*—Jeffrey T. Knapp
*Attorney, Agent, or Firm*—Laff, Whitesel, Conte & Saret, Ltd.

[57] ABSTRACT

A process and apparatus is available for producing a bonded metal coating. Solder material constructed so as to form a solder material shaped body (18) is transported by means of an energy transfer device (13), which is guided in a capillary tube (12) and which acts in the manner of a stamp, towards a bonding surface (24) of a substrate (25). The solder material then is acted upon by energy by means of the energy transfer device (13) for shaping and connection to the bonding surface (24).

11 Claims, 3 Drawing Sheets

PROCESS AND APPARATUS FOR PRODUCING A BONDED METAL COATING

The present invention relates to a process and/or an apparatus for producing a bonded metal coating.

In the prior art various processes are known for producing bonded metal coatings in the case of which processes the bonded metal coating is applied to a bonding surface galvanically, chemically, by vapour-deposition or by means of screen printing for example. These known processes have proved to be highly cost-intensive both owing to the complex manner in which they are performed and to the expensive apparatus necessary for performing the processes. This leads to the fact that for example the production costs for a chip which can be bonded or also used in the flip-chip process are essentially determined by the costs for producing the so-called "bumps". The costs associated with the production of bonded metal coatings in the field of pilot or small-scale production have a particularly exacerbating effect.

The present invention is based on the object of creating a process and/or an apparatus which enables/enable bonded metal coatings to be produced economically even for pilot or small-scale production.

This object is achieved by a process having the features of claim 1.

In the case of the process according to the invention a solder material constructed so as to form a solder material shaped body is transported with an energy transfer device which is guided in a capillary tube and which acts in the manner of a stamp towards a bonding surface of a substrate and is acted upon with energy by the energy transfer device for shaping and connection to the bonding surface.

In the case of the process according to the invention the energy transfer device is used on the one hand for transporting the solder material shaped body to the bonding surface; on the other hand the energy transfer device is used to transfer the melting energy into the shaped body in order to enable the shaped body to be shaped or the solder connection to be produced between the shaped body and the bonding surface.

As a result of suitable matching of the capillary tube cross-section and the shaped body mass the process according to the invention permits bonded metal coatings to be produced which are defined precisely in terms of size and shape without the complex masks or templates known from galvanic bonded metal coating processes for example having to be used. Moreover it is possible for the first time to process shaped bodies in the form of solder beads for example individually and in a precisely defined size and not, as was conventional hitherto, to use a solder paste in which solder beads are distributed in a manner which differs widely according to their diameters.

It has proved particularly advantageous if an optical fibre arrangement which consists of at least one optical fibre and which is used to transfer laser energy is used as the energy transfer device. This type of arrangement of the energy transfer device makes it possible to introduce in a precisely metered manner the energy required for shaping a shaped body or connecting it to a bonding surface.

In a method of performing the process according to the invention the solder material shaped body is fed to a delivery chamber at the end of the capillary tube in such a way that it is disposed between a bonding end of the energy transfer device and a delivery opening in the capillary tube before being bonded to the bonding surface. This alternative offers the possibility of processing prefabricated shaped bodies which are defined exactly in terms of shape and size.

In a further method of performing the process the solder material is fed in continuous form, for example as solder wire, to the delivery chamber at the end of the capillary tube in such a way that one end of the solder material projects into the delivery chamber formed between a bonding end of the energy transfer device and a delivery opening in the capillary tube such that the shaped body is formed as a result of energy acting on the end of the solder material during the course of a remelting process which occurs in the delivery chamber.

As a result thereof it is unnecessary to have the shaped bodies available in an already finished form; on the contrary it is possible to use for example a wire as the starting material for the shaped bodies such that the intermediate step of producing shaped bodies of a particular shape before the process for producing the bonded metal coating is performed is dispensed with.

The shaped body adhering in the case of the construction to the continuous solder material can likewise be separated as a result of the admission of energy by means of the energy transfer device.

In addition however it is also possible to separate mechanically the shaped body which is initially formed such that it adheres to the continuous solder material, by separating the shaped body from the continuous solder material by means of the bonding end of the energy transfer device or a suitable separating device.

It has proved particularly advantageous if, before it is applied to the bonding surface, the shaped body is held in the delivery chamber by a holding device for example in the form of a vacuum device. This enables the delivery opening of the capillary tube to be positioned exactly over the bonding surface without contact having to be necessary between the delivery opening and the bonding surface in order to hold the shaped body securely in the delivery chamber.

In order to achieve the stated object the apparatus for producing a bonded metal coating has the features of claim 8.

The apparatus according to the invention is provided with a capillary member for accommodating and guiding an energy transfer device which is constructed in the manner of a stamp and can be connected to an energy source, the capillary member comprising a feed device for feeding solder material which feed device leads into a delivery chamber which is at the end of the capillary tube and which is formed between a bonding end of the energy transfer device and a delivery opening in the capillary tube.

This apparatus enables the above-mentioned process to be performed whereby the above-mentioned advantages can be attained.

If the energy transfer device is comprised of an optical fibre arrangement comprising at least one optical fibre, the energy necessary for shaping the shaped body and for connecting the shaped body to the bonding surface can be metered particularly well and introduced into the shaped body in a highly concentrated manner within the shortest possible time.

If the delivery chamber is provided with a holding device in the form of a vacuum device, it is on the one hand possible to position exactly the capillary member constructed approximately in the manner of a bonding head above the bonding surface, the shaped body being held securely in the delivery chamber by the vacuum device. On the other hand the vacuum device can assist the feeding of the shaped body out of the feed device into the delivery chamber in order to position it there for the subsequent shaping process.

It has proved particularly advantageous if the delivery chamber of the capillary member is formed at least partially as a shaping die. In particular if the shaping die is disposed replaceably on the capillary member, the device can be adapted simply and rapidly to changing requirements with respect to the shape of the bonded metal coatings.

In the following the process according to the invention and the apparatus according to the invention will be explained in further detail by means of embodiments given by way of example and with reference to the enclosed drawings in which.

Figure 1:
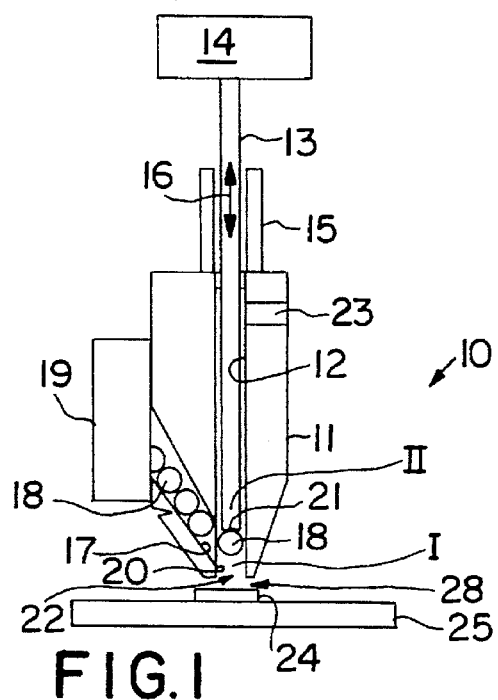
FIG. 1 shows a bonded metal coating apparatus in a first embodiment immediately before the application of a bonded metal coating.

FIG. 1 shows a bonded metal coating apparatus 10 having a capillary member 11 comprising an optical fibre 13 which is introduced into a capillary tube 12 and which is connected to a laser source 14. The optical fibre 13 can be moved in a reciprocating manner in the directions of the double arrow 16 by means of an advance device 15 disposed on the capillary member 11.

Provided in the capillary member 11 is a feed device which here is in the form of a feed duct 17 and which is used to feed individual solder material shaped bodies 18 out of a solder material reservoir 19 into a delivery chamber 20 formed at the lower end of the capillary tube 12.

The capillary member 11 can be formed such that at is movable multiaxially in the manner of a bonding head. Instead of the energy transfer device which here is in the form of an optical fibre 13 for example and is connected to a laser source 14 it is also possible to use a thermode for example supplied with electrical energy as the energy transfer device.

In the configuration shown in FIG. 1 the optical fibre 13 is in its upper end position such that the delivery chamber 20 of the capillary tube 12 is delimited at one end by a bonding end 21 of the optical fibre 13 and at its other end by a delivery opening 22 in the capillary tube 12.

In the embodiment shown in FIG. 1 of the bonded metal coating apparatus 10 there is located transversely to the capillary tube 12 and connected thereto an intake duct 23 which is connected to a vacuum device disposed externally of the capillary member 11 but not shown here in further detail. The intake duct 23 is located above the capillary tube 12 in suction connection with the delivery chamber 20.

The bonded metal coating apparatus 10 is used for applying a bonded metal coating to a bonding surface in this case in the form of a solder pad 24 on a substrate 25 which can be in the form of a printed board, chip or the like.

In the following the application of a bonded metal coating to the solder pad 24 of the substrate 25 will be described starting from the initial position I of the optical fibre 13 or of its bonding end 21, which position is shown in dashed lines in FIG. 1. In the initial position I the bonding end 21 in the case of the embodiment illustrated here is substantially flush with the delivery opening 22 such that solder material shaped bodies 18 disposed in the feed duct 17 which is constructed so as to rise upwards obliquely are held back in the feed duct 17 by the optical fibre 13. If the bonding end 21 of the optical fibre 13 now moves into the charging position II shown in a solid line in FIG. 1, a shaped body 18 is charged out of the feed duct 17 under the effect of gravity into the delivery chamber 20. The vacuum device which is not shown in further detail in FIG. 1 is thus activated such that the solder material shaped body 18 located in the delivery chamber 20 is drawn towards the bonding end 21 of the optical fibre 13 by means of the vacuum acting via the intake duct 23 and the capillary tube 12 in the delivery chamber 20, and abuts said bonding end positioned thereagainst.

The vacuum acting in the delivery chamber 20 thus assists on the one hand the transfer of the solder material shaped body 18 from the feed duct 17 into the delivery chamber 20 and on the other hand holds the solder material shaped body 18 in defined abutment against the bonding end 21. Thus, differing from the illustration selected in FIG. 1, the capillary member 11 with the material shaped body 18 disposed in the delivery chamber 20 can also be disposed at any distance from the solder pad 24 without the solder material shaped body 18 being able to fall out of the delivery chamber 20.

Figure 2:
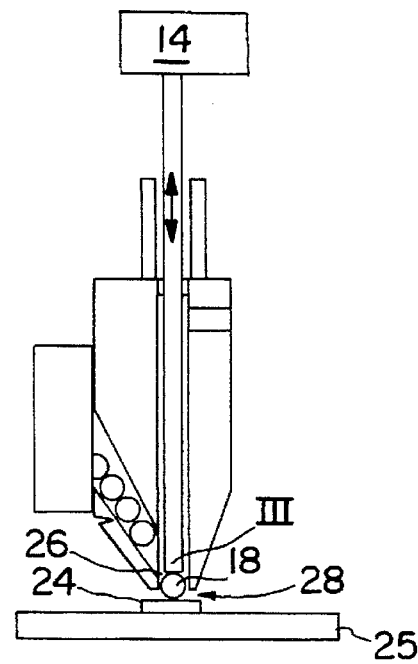
FIG. 2 shows the bonded metal coating apparatus shown in FIG. 1 during the application of the bonded metal coating.

Starting from the charging position II of the bonding end 21 of the optical fibre 13 shown in FIG. 1, the bonding end 21 is now, as shown in FIG. 2, transferred in the direction of the solder pad 24 into a striking position III in which the solder material shaped body 18 lies on the solder pad 24 and pressure can be exerted as necessary onto the solder material shaped body 18 via the bonding end 21. In the striking position III the laser source 14 is activated such that laser energy can act upon the solder material shaped body 18 through the optical fibre 13. As a result of the admission of laser energy the solder material shaped body 18 is softened such that the latter can be connected to the solder pad 24 in order to form a bonded metal coating. If necessary the remelting process can be overridden by corresponding actuation of the advance device 15 by the admission of pressure.

Figure 3:
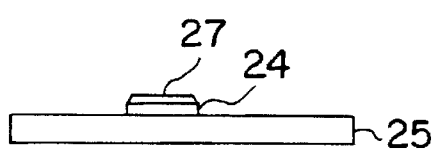
FIG. 3 shows an embodiment of a bonded metal coating.

FIG. 3 shows by way of example the appearance of a bonded metal coating 27 when a gap 28 shown in FIGS. 1 and 2 is retained during the shaping of the solder material shaped body 18. Whilst the bonded metal coating 27 is being produced and during the shaping process the solder material shaped body 18 penetrates the gap 28 formed between the solder pad 24 and the delivery opening 22 in order to form a bonded metal coating for example which substantially corresponds to the solder pad 24 in terms of shape and size.

Figure 4:
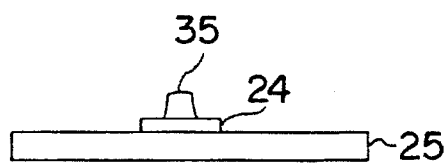
FIG. 4 shows a further embodiment of a bonded metal coating.

If the capillary tube 12 in the vicinity of the delivery opening 22 is formed as a shaping die 26, the bonded metal coating 35 illustrated in FIG. 4 and in the form predetermined by the shaping die 26 can be formed by the shaping of the solder material shaped body 18 and its connection to the solder pad 24. In this respect, differing from the illustrations in FIGS. 1 and 2, the delivery opening 22 is positioned opposite the solder pad 24 substantially without a gap.

Taking the above description as a basis it is clear that any shape and size of bonded metal coatings can be produced by a corresponding structure of the shaping die 26.

Figure 5:
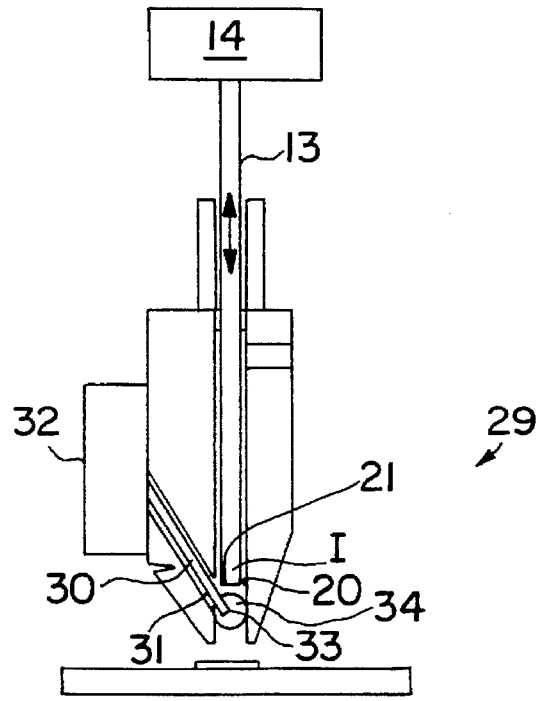
FIG. 5 shows a further embodiment of a bonded metal coating apparatus immediately before the application of a bonded metal coating.
Figure 6:
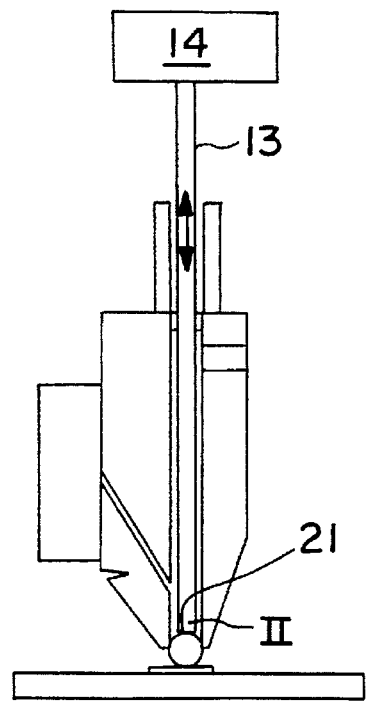
FIG. 6 shows the bonded metal coating apparatus illustrated in FIG. 5 during the application of the bonded metal coating.

FIGS. 5 and 6 show in a further embodiment a bonded metal coating apparatus 29 in the case of which the solder material is fed in the form of a solder wire 30 instead of in the form of solder material shaped bodies 18. Some differences of the bonded metal coating apparatus 29 with respect to the bonded metal coating apparatus 10 can be deduced therefrom and substantially concern a feed duct 31 and a solder material reservoir 32 whereas the other components and parts of the bonded metal coating apparatus 29 which have the same reference numerals as the corresponding parts and components of the bonded metal coating apparatus 10 are constructed identically thereto.

In the case of the bonded metal coating apparatus 29 the solder material reservoir 32 is used to accommodate a wire coil (not shown in greater detail) from which the solder wire 30 is unwound by means of an unwinding device (likewise not shown) and is advanced through the feed duct 31 into the delivery chamber 20.

In the case of the bonded metal coating apparatus 29 shown in FIG. 5 the initial position I is determined by the configuration shown in FIG. 5 in which the bonding end 21 of the optical fibre 13 is in its retracted position and a solder wire end 33 projects below the bonding end 21 into the delivery chamber 20.

In this position the laser source 14 is activated in order to act upon the solder wire end 33 with laser energy via the optical fibre 13. Owing to the heating of the solder wire end 33 and the associated melting-on process, there forms from the solder wire end 33 a solder material shaped body 34 which is formed adhering to the solder wire 30.

In accordance with the construction of the solder material shaped body 34 shown in FIG. 5 the laser source 14 can be switched off such that the solder material shaped body 34 is sheared off mechanically from the solder wire 30 by the bonding end 21 when the bonding end 21 of the optical fibre 13 is transferred into its striking position II shown in FIG. 6 and a new solder wire end 33 forms which is available for a subsequent bonded metal coating process.

The solder material shaped body 34 is now in an intermediate position between the solder pad 24 and the bonding end 21 of the optical fibre 13 in a position which corresponds to the position shown in FIG. 2 such that as described above the solder material shaped body 34 can be shaped for the connection to the solder pad 24 and the formation of a bonded metal coating.

Figure 7:
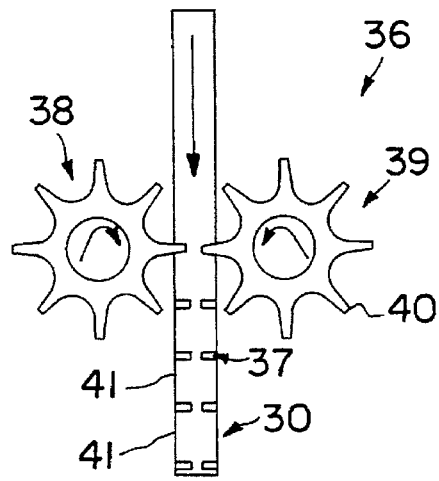
FIG. 7 shows a solder wire advance device.

FIG. 7 shows a basic diagram of a solder wire advance device 36 which can be disposed for example on the solder material reservoir 32 (FIG. 8) and is used both to advance the wire through the feed duct 31 and to form predetermined separation points 37 which are reduced in diameter. To this end the advance device comprises two toothed wheels 38, 39, having teeth 40, which rotate in opposite senses and of which at least one is driven. In this respect the teeth 40 sink into the solder wire 30 and solder wire shaped bodies 41 which are connected to one another by the predetermined separation points 37 are formed.

Figure 8:
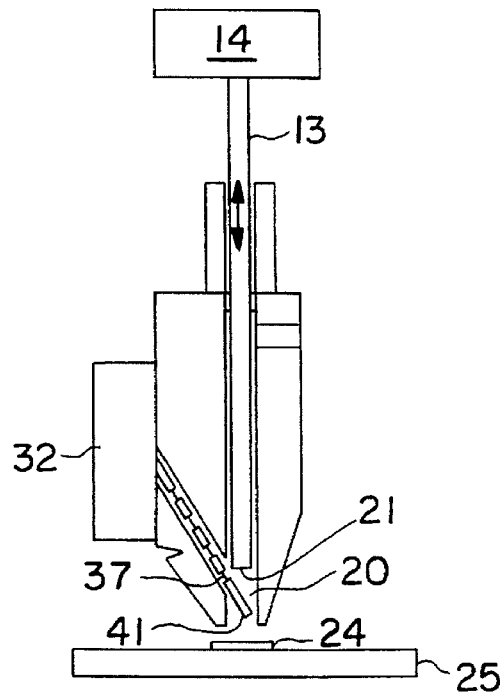
FIG. 8 shows the bonded metal coating apparatus illustrated in FIG. 5 using solder wire provided with predetermined separation points.

FIG. 8 shows a solder wire 30 which is provided with predetermined separation points 37 and of which the solder wire shaped member 41 which is to the fore in the advance direction is introduced into the delivery chamber 20. It is clear from the illustration that separation of the solder wire shaped member 41 by the bonding end 21 of the optical fibre 13 or some other suitable separating device is considerably facilitated owing to the predetermined separation point 37 of which the cross-section is greatly reduced; in particular when laser energy acts upon the predetermined separation point 37 at the same time as a separating process is performed. After separation the shaped member 41 falls onto the solder pad 24 or is moved thereto with the bonding end 21 of the optical fibre 13, acted upon by laser energy and melted into a bonded metal coating 42 (FIG. 9).

Figure 9:
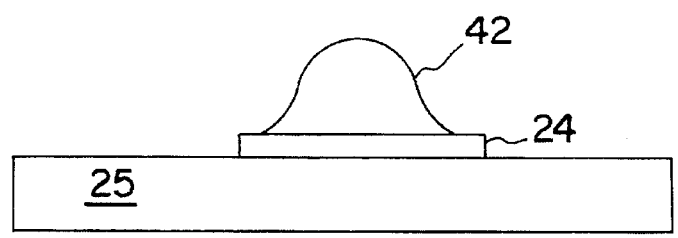
FIG. 9 shows a further embodiment of a bonded metal coating.

All the variants of the process described above by way of example and the variants of the apparatus used in this respect have the advantage that bonded metal coatings which are formed in the manner of mounds as shown in FIG. 9 for example can be applied in any surface distribution (ball-gate array) to the surface of a substrate in any form.

I claim:

1. A process for producing a bonded metal coating at a bonding surface of a substrate comprising the steps of:
   (a) providing solder material in the form of a shaped, solder material body;
   (b) providing an energy transfer device guided in a capillary tube;
   (c) said energy transfer device acting as a stamp to transport said solder material toward said bonding surface; and
   (d) acting upon said solder material with energy from said energy transfer device for reshaping said solder material and providing a connection to the bonding surface.

2. The process of claim 1, wherein step (b) thereof further comprises the step of:
   (b1) providing as part of said energy transfer device at least one optical fiber means for receiving and transferring laser energy.

3. The process of claims 1 or 2, wherein step (a) thereof further comprises the step of:
   (a1) feeding said shaped, solder material body to a delivery chamber disposed at an end of said capillary tube such that said solder material is disposed between a bonding end of said energy transfer device and a delivery opening in said capillary tube before being bonded to said bonding surface.

4. The process of claim 3 wherein step (a1) thereof further comprises the step of:
   (a1a) retaining said shaped, solder material body in said delivery chamber using a vacuum prior to applying said shaped, solder material body to said bonding surface.

5. The process of claims 1 or 2, wherein step (a) thereof further comprises the steps of:
   (a1) feeding continuous solder material to a delivery chamber disposed at an end of said capillary tube between a bonding end of said energy transfer device and a delivery opening in the capillary tube;
   (a2) causing said continuous solder material to project into said delivery chamber; and
   (a3) forming a shaped, solder material body by remelting said solder material using energy admitted by said energy transfer device.

6. The process of of claim 5, therein step (a3) thereof further comprises the step of:
   (a3a) separating said shaped, solder material body from said continuous solder material using energy admitted by said energy transfer device.

7. The process of claim 5, wherein step (a3) thereof further comprises the steps of:
   (a3a) forming a shaped, solder material body using energy admitted by said energy transfer device toward an end of said continuous solder material such that said shaped, solder material body adheres to said end; and
   (a3b) separating said shaped, solder material body from said continuous solder material using said bonding end of said energy transfer device.

8. Apparatus for producing a bonded metal coating comprising:

a capillary member having a capillary tube, said capillary tube forming a delivery opening at an end thereof; and energy transfer means at least partially disposed in said capillary tube and having a bonding end;

said capillary tube forming a delivery chamber located in said tube intermediate said delivery opening and said bonding end of said energy transfer means;

said capillary member further comprising a solder material feed means leading into said delivery chamber.

9. The apparatus of claim 8 wherein said energy transfer means further comprises at least one optical fiber.

10. The apparatus of claims 8 or 9, further comprising vacuum-operated holding means operatively coupled to said delivery chamber.

11. The apparatus of claims 8 or 9 wherein said delivery chamber is formed at least partially as a shaping die.

* * * * *